US009123846B2

(12) United States Patent
Le Perchec et al.

(10) Patent No.: US 9,123,846 B2
(45) Date of Patent: Sep. 1, 2015

(54) PHOTOVOLTAIC MODULE COMPRISING A LOCALISED SPECTRAL CONVERSION ELEMENT AND PRODUCTION PROCESS

(71) Applicant: COMMISSARIAT À L'ENERGIE ATOMIQUE ET AUX ENERGIES ALTERNATIVES, Paris (FR)

(72) Inventors: Jérôme Le Perchec, Grenoble (FR); Philippe Voarino, Nice (FR)

(73) Assignee: COMMISSARIAT A L'ENERGIE ATOMIQUE, Paris (FR)

( * ) Notice: Subject to any disclaimer, the term of this patent is extended or adjusted under 35 U.S.C. 154(b) by 0 days.

(21) Appl. No.: 14/385,431

(22) PCT Filed: Mar. 12, 2013

(86) PCT No.: PCT/FR2013/000065
§ 371 (c)(1),
(2) Date: Sep. 15, 2014

(87) PCT Pub. No.: WO2013/135980
PCT Pub. Date: Sep. 19, 2013

(65) Prior Publication Data
US 2015/0034147 A1  Feb. 5, 2015

(30) Foreign Application Priority Data
Mar. 13, 2012 (FR) .................................. 12 00760

(51) Int. Cl.
*H01L 31/042* (2014.01)
*H01L 31/055* (2014.01)
(Continued)

(52) U.S. Cl.
CPC ........ *H01L 31/042* (2013.01); *H01L 31/02322* (2013.01); *H01L 31/0481* (2013.01); *H01L 31/055* (2013.01); *Y02E 10/52* (2013.01)

(58) Field of Classification Search
CPC . H01L 31/055; H01L 31/0481; H01L 31/042; H01L 31/02322
USPC ....................................... 136/251, 244; 438/65
See application file for complete search history.

(56) References Cited

U.S. PATENT DOCUMENTS 4,127,425 A * 11/1978 Chambers ...................... 136/247
4,130,445 A * 12/1978 Blieden ......................... 136/247
(Continued)

FOREIGN PATENT DOCUMENTS

DE  20 2009 007 771 U  9/2009
EP       2 372 786 A1  10/2011
(Continued)

*Primary Examiner* — Golam Mowla
(74) *Attorney, Agent, or Firm* — Oliff PLC

(57) ABSTRACT

A photovoltaic module including a plate transparent to the incident electromagnetic radiation, a photovoltaic cell including an active face arranged facing said transparent plate, a spectral conversion element including a luminescent material formed by at least a first spectral conversion area arranged facing a lateral face of the photovoltaic cell, a direct transmission area separating the transparent plate from the photovoltaic cell, the spectral conversion element including a second spectral conversion area extending the first spectral conversion area, the second spectral conversion area being positioned on the peripheral edge of the active face of the photovoltaic cell, so that the part of the active face of the photovoltaic cell directly receiving the incident electromagnetic radiation represents between 40% and 90% of the total surface of the active face of the photovoltaic cell.

17 Claims, 5 Drawing Sheets

(51) Int. Cl.
*H01L 31/0232* (2014.01)
*H01L 31/048* (2014.01)

(56) References Cited

U.S. PATENT DOCUMENTS

| | | | | |
|---|---|---|---|---|
| 4,135,537 A | * | 1/1979 | Blieden et al. | 136/247 |
| 4,140,544 A | * | 2/1979 | Sill | 136/247 |
| 4,144,097 A | * | 3/1979 | Chambers et al. | 136/247 |
| 4,153,813 A | * | 5/1979 | Blieden et al. | 136/247 |
| 4,155,371 A | * | 5/1979 | Wohlmut et al. | 136/247 |
| 4,159,212 A | * | 6/1979 | Yerkes | 136/247 |
| 4,173,495 A | * | 11/1979 | Rapp et al. | 136/259 |
| 4,175,980 A | * | 11/1979 | Davis et al. | 136/247 |
| 4,186,033 A | * | 1/1980 | Boling et al. | 136/247 |
| 4,324,946 A | * | 4/1982 | Gravisse | 136/247 |
| 4,329,535 A | * | 5/1982 | Rapp | 136/259 |
| 4,357,486 A | * | 11/1982 | Blieden et al. | 136/247 |
| 4,488,047 A | * | 12/1984 | Thomas | 250/486.1 |
| 5,431,742 A | * | 7/1995 | Kleinerman | 136/247 |
| 6,410,843 B1 | | 6/2002 | Kishi et al. | |
| 6,538,191 B1 | * | 3/2003 | MacDonald | 136/247 |
| 2004/0095658 A1 | * | 5/2004 | Buretea et al. | 359/853 |
| 2009/0027872 A1 | * | 1/2009 | Debije et al. | 362/84 |
| 2009/0056791 A1 | * | 3/2009 | Pfenninger et al. | 136/247 |
| 2009/0095341 A1 | * | 4/2009 | Pfenninger et al. | 136/246 |
| 2009/0110356 A1 | * | 4/2009 | Xiang et al. | 385/129 |
| 2009/0178704 A1 | | 7/2009 | Kalejs et al. | |
| 2010/0139749 A1 | * | 6/2010 | Mapel | 136/255 |
| 2010/0139765 A1 | * | 6/2010 | Mapel | 136/257 |
| 2010/0139769 A1 | * | 6/2010 | Mapel | 136/259 |
| 2010/0180932 A1 | * | 7/2010 | Wang et al. | 136/246 |
| 2010/0307584 A1 | * | 12/2010 | Goldschmidt et al. | 136/259 |

FOREIGN PATENT DOCUMENTS

| | | |
|---|---|---|
| GB | 2474292 A | 4/2011 |
| WO | WO 99/56317 A1 | 11/1999 |
| WO | WO 2008/110567 A1 | 9/2008 |
| WO | WO 2010/139290 A2 | 12/2010 |
| WO | WO 2011/082806 A2 | 7/2011 |

* cited by examiner

PHOTOVOLTAIC MODULE COMPRISING A LOCALISED SPECTRAL CONVERSION ELEMENT AND PRODUCTION PROCESS

BACKGROUND OF THE INVENTION

The invention relates to a photovoltaic module to convert an incident electromagnetic radiation into electric power, and to a method for producing one such photovoltaic module.

STATE OF THE ART

A photovoltaic module conventionally comprises a front plate and a rear plate between which one or more photovoltaic cells electrically connected to one another are placed, and an encapsulation material in which the cell or cells are sunk.

One of the major issues in the field of photovoltaic modules is to increase the photovoltaic conversion efficiency, hereafter referred to as conversion efficiency, or to make the module more efficient when it is subjected to a diffuse light (cloudy conditions).

A first approach to meet these requirements is to use a reflector arranged on the rear plate of the photovoltaic module in order to redirect the incident light to the cells of the module.

For example, U.S. Pat. No. 6,410,843 and International Application WO 99/56317 propose fitting a reflector device on the rear plate to reflect the incident light to the rear surface of the cells. In addition, the inner surface of the rear plate is structured in the form of diffracting patterns, with for example a pyramidal structure. The structured surface is then covered by a reflecting coating, for example made from aluminium or silver base. In this case, the spaces between the adjacent cells let the incident electromagnetic radiation pass to the rear plate of the photovoltaic module, where it is reflected by the reflector and redirected onto the rear surface of said cells.

US Patent application 2009/0178704 describes the use of a rear plate covered by a reflector having a pyramidal structure. It also describes the use of metallic particles enveloped in a plastic film covering the reflector and used to diffuse the light.

These photovoltaic module configurations using a reflecting surface structured in pyramidal form do however require precise and costly deposition techniques. Indeed, on the one hand the angle of the pyramids of the textured surface has to have a precise value in order to be able to correctly reflect the incident rays, and on the other hand the materials used for the coating are expensive.

To increase the conversion efficiency of photovoltaic modules, another approach consists in modifying a part of the solar spectrum effectively perceived by the cells.

For example, International Application WO2008/110567 proposes modifying a part of the solar spectrum effectively perceived by the cells by placing luminescent species (called spectral conversion elements) in the encapsulation medium situated between the front plate of the module and said cells. Such an encapsulation medium completely covers the front surface of the photovoltaic cells and may also cover their rear surface.

US Patent application 2009/0095341 also describes a photovoltaic module where the photovoltaic cells are completely covered by a layer containing the spectral conversion elements.

The spectral conversion elements conventionally used are luminescent species able to at least partially absorb the photons reaching the encapsulation medium and to re-emit them at different wavelengths, in particular higher wavelengths.

Numerous spectral conversion elements can further be used, these being able to be organic and inorganic fluorescents materials (DE 20 2009 007771) or semiconductor materials (US 2010/0180932).

However, the luminescent materials most often have a quantum efficiency of less than 1. Spectral conversion materials thus absorb more photons than they re-emit, thereby reducing the number of photons reaching the photovoltaic cells. This effect is all the more marked for long-duration applications.

Furthermore, the isotropic re-emission of light is diffuse. This re-emission introduces a light leakage cone via the outer surfaces of the photovoltaic module: a part of the re-emitted light is lost via the outer surfaces. There is therefore a loss of luminous flux finally reaching the photovoltaic cells of the module.

According to an alternative, it is proposed to introduce spectral conversion elements at the level of the connection elements of the photovoltaic cells (WO 2011/082806).

As described in Patent application EP 2,372,786 and as represented in FIG. 1, it has also been proposed to arrange the spectral conversion elements only in the spaces between the photovoltaic cells of the module.

Such a solution is however not completely satisfactory as, on the one hand, the inter-cell area has to be sufficiently large to obtain a significant modification of the solar spectrum by the spectral conversion elements, and, on the other hand, a large part of the emitted radiation is lost due to the leakage cones and to the optical discontinuity between the area between the cells and the active surface of the cell.

OBJECT OF THE INVENTION

The object of the invention is to remedy the shortcomings of the prior art and in particular to propose a photovoltaic module enabling leakage cone phenomena to be limited and an improved conversion efficiency to be achieved, while at the same time being easy to implement, by means of a robust and inexpensive production method.

These objectives tend to be met by the appended claims.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
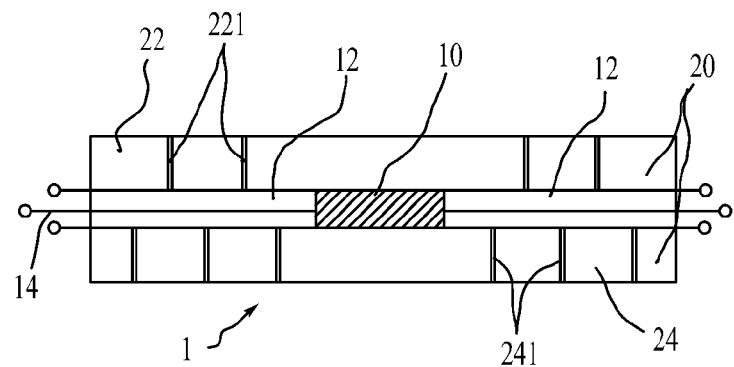
FIG. 1 represents a photovoltaic module according to the prior art, in schematic manner.
Figure 2:
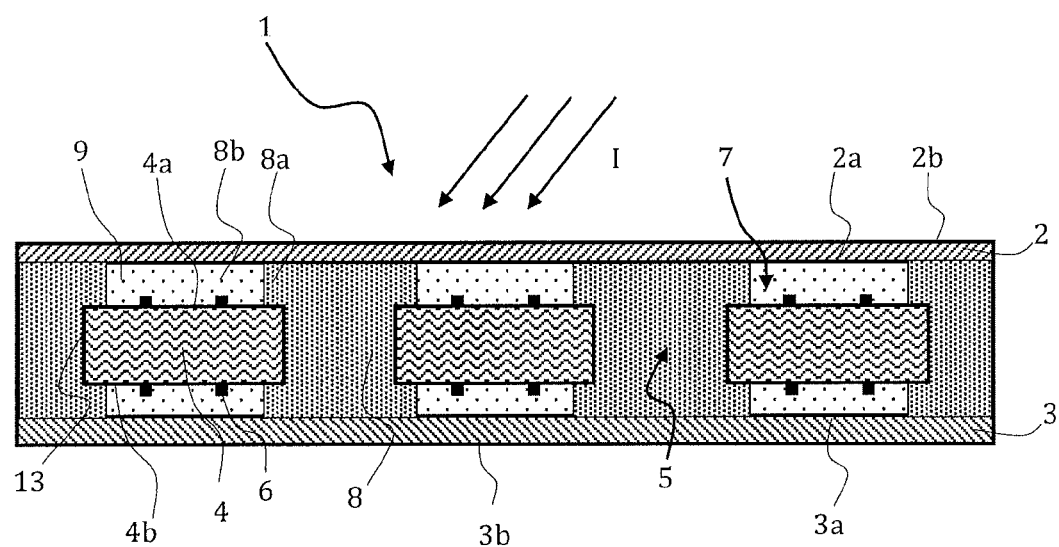
FIG. 2 represents a photovoltaic module according to a particular embodiment of the invention, in schematic manner in cross-section.
Figure 3:
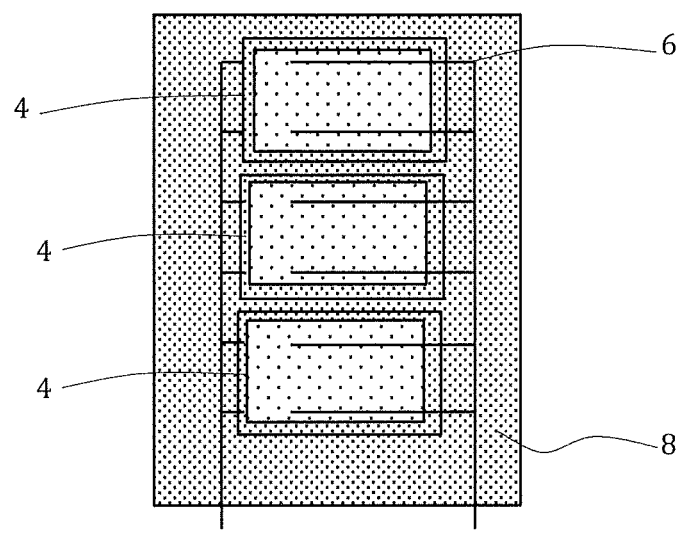
FIG. 3 represents a photovoltaic module according to a particular embodiment of the invention, in schematic manner in top view.

As illustrated in FIG. 2, a photovoltaic module 1, designed to convert an incident electromagnetic radiation I into electric power, in particular comprises:
- a front plate 2 and a rear plate 3, each respectively comprising an inner face 2a and 2b and an outer face 3a and 3b,
- at least one photovoltaic cell 4 arranged between front plate 2 and rear plate 3, comprising at least one active face 4a, i.e. a face able to capture photons of the incident light rays reaching said face 4a and to transform them into electricity.

Front plate 2 of the module is transparent to the incident electromagnetic radiation, in particular to solar rays. What is meant by front plate is the plate exposed to the incident electromagnetic radiation I. This is for example the plate of the photovoltaic module that is exposed to the sun. Front plate 2 is advantageously made from glass or from plastic.

Rear plate 3 can also be transparent to the electromagnetic radiation. In the case of a two-face module, it is for example made from glass or from plastic. Otherwise, it can be made from metal and/or from polymer.

The photovoltaic module advantageously comprises several photovoltaic cells 4. Photovoltaic cells 4 are then preferably coplanar and separated from one another by inter-cell spaces 5.

Photovoltaic cells 4 can be made from amorphous, monocrystalline or polycrystalline silicon or from a germanium base. They can also be organic cells or made from inorganic thin layers such as a cell with a thin layer of CIGS, CdTe, amorphous silicon or III/V semiconductor. The photovoltaic cells can comprise an anti-reflection layer, for example made from silicon nitride.

Each photovoltaic cell 4 comprises two opposite main faces 4a and 4b and at least four lateral faces 13. Lateral surfaces 13 thus extend the main faces and are substantially perpendicular to said main faces. Main faces of the cells 4 are preferably parallel to front plate 2 and rear plate 3 of photovoltaic module 1. At least one of the main faces of the photovoltaic cell is an active face. When only one of the main faces of the photovoltaic cell is active, it is the face exposed to the incident electromagnetic radiation I, the face facing transparent front plate 2.

The module comprises at least one encapsulation material, and in particular at least one polymer encapsulation material in which photovoltaic cells 4 are sunk. What is meant by sunk is that cells 4 are enveloped by the encapsulation material.

The encapsulation material is also called packager 7 or encapsulating medium or encapsulation medium. It provides the mechanical cohesion of the module once the latter has been assembled.

The encapsulation medium is preferably electrically insulating. It can be formed by one or more thin layers comprising a polymer material. Preferably, the polymer material is for example formed by at least one polymer of vinyl acetate type, advantageously ethylene vinyl acetate (EVA). It can also be formed by a polymer of polyvinyl butyral (PVB) type, of polyvinyl acetate (PVA) type or any other suitable polymer.

Furthermore, the polymer material is advantageously at least partially cross-linked. It can also be formed by silicone.

Photovoltaic module 1 further comprises a spectral conversion element. The spectral conversion element comprises a luminescent material designed to be excited by the incident electromagnetic radiation I. The spectral conversion element enables a part of the spectrum of incident electromagnetic radiation I, in particular the solar spectrum, to be modified.

In particular, the luminescent material can be fluorescent. In this case, the light re-emitted by the excited material can be of the same wavelength or of larger or smaller wavelength than the absorbed light. Preferably, the re-emitted light has a larger wavelength than the absorbed wavelength. In particular, the fluorescent material is chosen from organic colorants, optical brighteners, microparticles or nanoparticles doped with lanthanide ions, organo-lanthanide complexes, quantum dots and mixtures of the latter. The nanoparticles are preferably nanocrystals, and the lanthanide ions are for example cerium and/or erbium ions. A cerium-doped YAG oxide or erbium-doped fluorides can also be used. The organo-lanthanide complexes are crystals made from lanthanide ions sensitized by organic ligands. Advantageously, the fluorescent materials used have a quantum efficiency of more than 75% and have a good resistance to photobleaching.

The luminescent material can also be chosen from phosphorescent materials. In this case, the light absorbed under illumination of incident electromagnetic radiation I can be restored, for example at night or in the presence of cloud, and thereby provide a usable signal if the area of the material is sufficiently large. Preferably, the phosphorescent material is chosen from the class of aluminates doped with rare earth ions. It can for example be formed by europium-doped strontium aluminate of formula $SrAl_2O_4:Eu^{2+},Dy^{3+},B^{3+}$ or calcium aluminate of formula $CaAl_2O_4:Eu^{2+}, Nd^{3+}$. The phosphorescent material can also be chosen from the class of sulphides, in particular $ZnS:Cu^+,Co^{2+}$ and CaS or from the class of alumino-silicates, for example $MAl_2Si_2O_8:Eu^{2+}$ with M=Ca,Sr,Ba. These materials can for example be obtained in the form of micrometric powders or by sol-gel means.

According to a preferred embodiment, the spectral conversion element is formed by at least a first spectral conversion area 8, 8a, 8b arranged facing a lateral face of photovoltaic cell 4.

The spectral conversion element comprises a second spectral conversion area extending the first spectral conversion area. This second spectral conversion area is positioned on the peripheral edge of the active face 4a of photovoltaic cell 4, directly on said active face 4a, so that the part of active face 4a of photovoltaic cell 4 directly receiving the incident electromagnetic radiation I represents between 40% and 90% of the total face of active face 4a of photovoltaic cell 4.

What is meant by peripheral edge of the active face is the edge or periphery of active face 4a of photovoltaic cell 4. The second spectral conversion area therefore partially covers active face 4a of the photovoltaic cell.

Area 8 comprising the luminescent material is also called photo-active area or luminescent area.

According to a preferred embodiment, spectral conversion areas 8 comprise a matrix advantageously formed by an encapsulation material, in particular made from polymer, in which the luminescent material is dispersed. The encapsulation medium is preferably transparent to the wavelengths useful for the luminescent materials.

Photo-active areas 8 arranged in inter-cell spaces 5 advantageously enable the photons reaching these spaces to be used. Luminescent areas 8 are in the same plane as cells 4.

Due to inter-cell spaces 5 between adjacent cells 4, the photons originating from the incident electromagnetic radiation I falling at the level of these inter-cell spaces 5 do not in general interact with cells 4, and these photons are in the prior art lost.

The photons which would normally be lost are absorbed by the luminescent materials and re-emitted. What is meant by an inter-cell space 5 is the region situated between two adjacent and coplanar cells 4. This region preferably has the same thickness as cells 4 and the same width.

In addition, with the lateral waveguide effects, the re-emitted photons are redirected to active faces 4a of photovoltaic cells 5. All the inter-cell spaces 5 or only a part of inter-cell spaces 5 can be occupied by the first areas 8. In addition, for each inter-cell space 5, the whole space or only a fraction of the space can be filled by a first area 8.

Photo-active areas 8, placed on the edges of the active face, are arranged such that at least one direct transmission area 9 separates transparent plate 2 from photovoltaic cell 4. This area 9 is configured to transmit incident electromagnetic radiation I directly from transparent plate 2 to at least 40% to 90% of active face 4a of photovoltaic cell 4. Such a percentage advantageously enables the optical performances of the cells to be improved.

According to a preferred embodiment, direct transmission area 9 is devoid of any spectral conversion element, i.e. this area does not contain any luminescent material and it is such that the incident electromagnetic radiation I passes through the polymer encapsulation material without the incident electromagnetic radiation I being either reflected or absorbed by the luminescent materials.

Area 9 can be considered as being an optically neutral area, i.e. a non photo-active area, devoid of luminescent materials.

Transmission of the incident electromagnetic radiation I corresponds more particularly to the proportion of the incident electromagnetic radiation I which reaches the part of active face 4a, for example through the encapsulation media. Preferably, neutral area 9 is a very high transmission (or direct transmission) area, i.e. an area having a proportion of incident electromagnetic radiation I reaching active face 4a that is greater than 90% and preferably close to or even equal to 100%. Neutral area 9 is advantageously formed by the polymer encapsulation material used to form encapsulation medium 7 and, due to its form/nature, it ensures direct transmission from transparent plate 2 to active face 4a of cell 4. What is meant by direct transmission is that the incident electromagnetic radiation I is directly transmitted to active face 4a of the cell without having been absorbed and re-emitted by the luminescent materials.

Such a configuration enables an optical continuity to be had at the periphery of photovoltaic cell 4: there is an optical continuity with inter-cell space 4a of photovoltaic cell 4, which further enables direct transfer to be performed without any loss of luminescence from area 8, 8a to active face 4a of cell 4. The luminous losses due to the leakage cone are thus reduced by a factor 2 compared with configurations where the luminescent materials are arranged only in the inter-cell spaces, as described in the prior art (EP 2,372,786).

The luminescent material is present continuously from inter-cell spaces 5 to active face 4a of photovoltaic cells 4, which advantageously enables the size of said inter-cell spaces 5 to be reduced thereby increasing the number of cells 4 arranged in the module and/or the dimensions of their active face 4a compared with a configuration where only the inter-cell spaces contain the spectral converter.

In addition, unlike the prior art (WO 2008/110567 and US 2009/0095341), the spectral conversion element is arranged in such a way that at least one direct transmission area 9 separates transparent plate 2 from photovoltaic cell 4.

The presence of at least one neutral area 9 between the front plate and photovoltaic cell or cells 4 thereby prevents any loss of luminous flux reaching the active face or faces 4a in a photovoltaic module 1 comprising a spectral conversion element using the luminescence phenomenon.

According to a preferred embodiment, the ratio between the optical index of direct transmission area 9 and the optical index of spectral conversion areas 8 is comprised between 0.9 and 1.2

Figure 4:
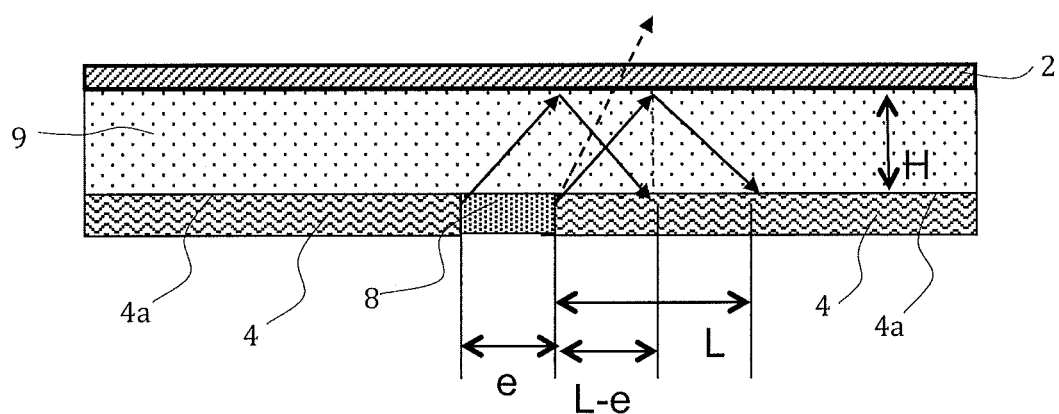
FIG. 4 represents an exclusion area in a photovoltaic module, in schematic manner in cross-section.
Figure 7:
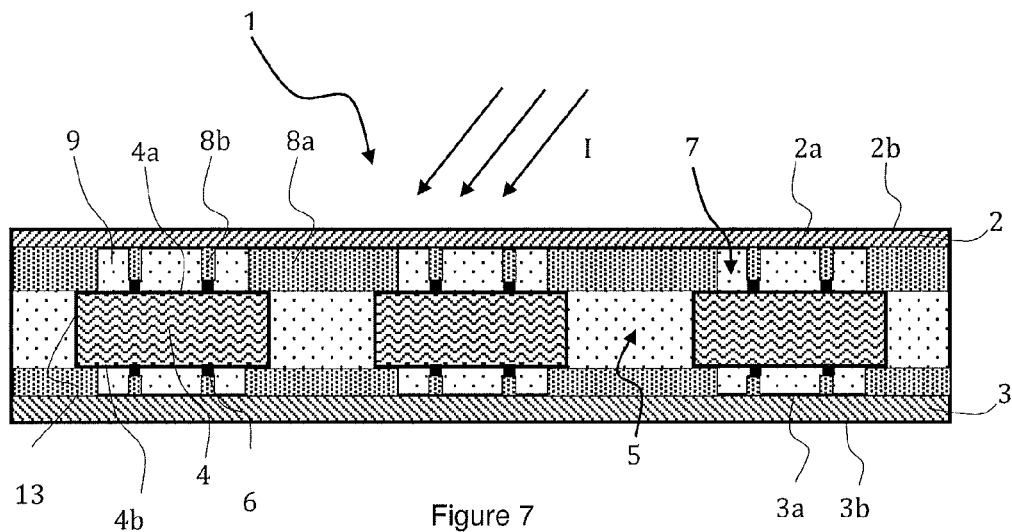

FIG. 4 represents a module having a half-thickness H equal to H=4 mm. The index of the encapsulation material and of glass front plate 2 are close to 1.5. Area 8 containing the spectral converter is located only between two photovoltaic cells 4, as represented in FIG. 7. Cells 4 are separated by an inter-cell space of width e.

The critical angle above which an electromagnetic radiation originating from inter-cell space 5 will be transmitted internally from photo-active area 8 to active face 4a of photovoltaic cell 4 is $\theta c = \arcsin(1/1.5)$, i.e. 41°.

There therefore exists an area called exclusion area, in photovoltaic module 1, of size L-e, which cannot receive the radiation originating from area 8 if the inter-cell space of width "e" is smaller than $L\sim 2H \sin(\theta c)$, i.e. 5.25 mm.

Figure 5:
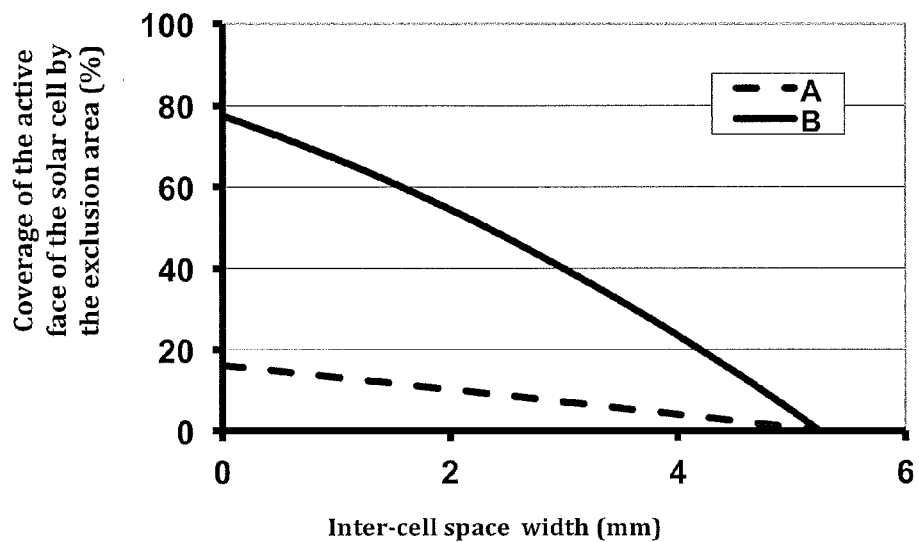
FIG. 5 represents a graph showing the percentage of coverage of the active face of the photovoltaic cell by the exclusion area versus the width of the inter-cell space.

The graph of FIG. 5 represents a percentage of coverage of active face 4a of photovoltaic cell 4 by the exclusion area versus the width of inter-cell space 5. For example, for an inter-cell spacing of 2 mm conventionally used in photovoltaic modules and for a solar cell with sides measuring 12.5 cm (plot A), the exclusion area corresponds to 10% of the active face of photovoltaic cell 4. For a cell with sides measuring 2 cm, the exclusion area corresponds to 55% of active face 4a of cell 4 (plot B).

The presence of the spectral converter on the edges of the cell therefore advantageously enables this exclusion area, which would otherwise be lost, to be used.

Photo-active areas 8 are placed in such a way that the part of active face 4a of photovoltaic cell 4 directly receiving the incident electromagnetic radiation I advantageously represents between 40% and 90% of the total surface of active face 4a of photovoltaic cell 4.

The photovoltaic module described in the foregoing is advantageously a module of two-face type, the photovoltaic cells having two opposite active faces 4a and 4b.

According to an alternative, it can be of single-face type. In this case, photo-active areas 8 are advantageously situated between cells 4 and front plate 2, whereas the space between cells 4 and rear plate 3 is neutral.

Figure 6:
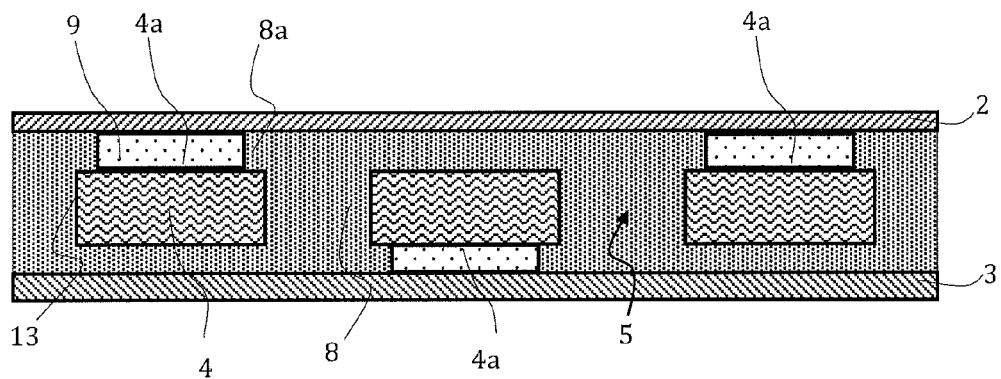
FIGS. 6 and 7 represent a photovoltaic module according to different particular embodiments of the invention, in schematic manner in cross-section.

According to another alternative and as represented in FIG. 6, photovoltaic cells 4 can have a single active face 4a. The cells are arranged in such a way that the active faces are directed alternately and successively towards front plate 2 and then towards rear plate 3, each inactive face being totally covered by the spectral converter. This configuration is advantageous in the case of inter-cell spaces 5 of small dimensions and of photovoltaic cells 4 of small sizes as the edges of the active faces of the cells will not be able to all receive the incident radiation in optimal manner on account of the geometric constraints.

Furthermore, the positioning of photo-active area or areas 8 inside the module can vary according to different embodiments. A neutral area, without any luminescent material, will thus be maintained between front plate 2 and each cell 4 in order to enable direct transmission of the incident electromagnetic radiation. This prevents a loss of luminous flux reaching active face 4a of the cells.

According to another preferential embodiment, as represented in FIG. 7, photo-active areas 8 are not located in inter-cell spaces 5, but they are advantageously separated by photovoltaic cells 4 and arranged on each side of said cells 4, between the latter and front plate 2 and rear plate 3. In particular, their arrangement is such that photo-active areas 8a containing the luminescent materials are situated on each side of inter-cell spaces 5 and partially cover photovoltaic cells 4, preferably up to 60% of the active face 4a of cells 4. This then enables at least one non photo-active area 9 to be kept between at least front plate 2 and each of photovoltaic cells 4. The incident electromagnetic radiation I is then directly transmitted via this area 9 from front plate 2 to at least a part of active face 4a of each photovoltaic cell 4.

The photons which, without the presence of photo-active areas 8 would be lost or unused, are thus absorbed by the luminescent elements of photo-active area or areas 8 and re-emitted to be converted by photovoltaic cell 4 into electricity. Furthermore, the presence of the neutral areas makes it possible to avoid a loss of flux reaching the active face of the cells.

For example, the photons can be re-emitted at wavelengths where the quantum efficiency of the cell is best: this can involve converting ultraviolet into red light for silicon photovoltaic cells 4.

In addition, the luminescent materials re-emit in isotropic manner, which enables the re-emitted light to be better trapped in photovoltaic module 1.

Active face 4a of each photovoltaic cell can be covered by one or more photo-active areas, on the edges and/or in the centre thereof.

For example, as represented in FIG. 7, main faces 4a and 4b of each photovoltaic cell 4 can be provided with electric contact tracks 6. According to advantageous particular embodiments, photoactive areas 8b containing the luminescent materials can be arranged on contact tracks 6. Each photo-active area 8b is then delineated in the space between said contact tracks 6 and the corresponding plate. The positioning of the luminescent materials on these contact tracks 6 is all the more pertinent as contact tracks 6 of cells 4 normally perform shadowing of the incident electromagnetic radiation: it in no way modifies the quantity of incident radiation reaching active face 4a of cell 4 and it moreover enables photons to be re-emitted which will be converted by active face 4a of cell 4.

To produce a photovoltaic module as represented in FIG. 2 for example, the production method comprises:

formation of an assembly comprising at least transparent plate 2 and an additional plate 3 between which there are placed the photovoltaic cell 4, the spectral conversion element, direct transmission area 9, at least one encapsulation film 10, advantageously made from polymer material, placed between transparent plate 2 and photovoltaic cell 4, the spectral conversion element being arranged facing a lateral face 13 of photovoltaic cell 4 and between photovoltaic cell 4 and transparent plate 2, on the edges of active face 4a of photovoltaic cell 4, hot pressing of said assembly to obtain the photovoltaic module.

According to a preferred embodiment, encapsulation film 10 can comprise at least two parts, one containing the luminescent material and the other without luminescent material, respectively forming at least spectral conversion areas 8 and direct transmission area 9, after hot pressing.

In addition, an additional encapsulation film 12 advantageously made from polymer material is placed when formation of the assembly takes place, facing a lateral face 13 of photovoltaic cell 4, said additional encapsulation film 12 comprising the luminescent material in dispersed form.

When assembly is performed, front plate 2 and rear plate 3 are placed in parallel manner to one another, encapsulation films 10 and 11 being respectively arranged facing inner faces 2a and 3a of front plate 2 and rear plate 3. Photovoltaic cells 4 are arranged in coplanar manner between front plate 2 and rear plate 3, and more particularly between the two encapsulation films 10 and 11.

If the module comprises a film 12, the latter is arranged between cells 4 in order to fill the inter-cell spaces over the whole width of cells 4. Film 12 preferably has a width equal to that of front plate 2 and rear plate 3 and to that of encapsulation films 10 and 11.

Film 12 advantageously surrounds the cells over their whole width.

Encapsulation films 10 and 11 are films made from a polymer material, able to be eliminated by hot pressing to form encapsulation material 7 of photovoltaic module 1 in which cells 4 are sunk.

The material or materials forming first encapsulation film 10 can be identical to or different from those forming second encapsulation film 11. They are however preferably made from polymer material. Such a polymer material is also called polymer encapsulation material. It is at least partially cross-linked before assembly of the module is performed and is able to be laminated. Advantageously, the base of the encapsulation films is formed by a self-supporting polymer of vinyl-acetate type. What is meant by self-supporting is a film able to hold itself up without requiring any additional support. Such films can exist for example in the form of rough sheets that are easy to handle.

Film 12 is advantageously a film made from polymer material, preferably able to be laminated by hot pressing. In particular, it can be made with the same polymer material as encapsulation films 10 and 11. In this case, it nevertheless comprises at least one luminescent material dispersed in volumic manner and preferably in homogenous manner in said polymer material. Area 8 comprises said encapsulation polymer.

Film 12 can be obtained by injection of the luminescent material directly into the polymer material composing said film.

The luminescent materials can be mixed in a host material such as a polymer material, in particular having a base formed by silicone, an epoxy resin or liquid solutions used for sol-gel depositions such as for example a solution containing silicon alcoxides. Advantageously, the luminescent materials are photo-stabilized when they are inserted in one of these host materials.

What is meant by host material is a material able to be doped, functionalized by the luminescent materials. The luminescent materials are thus inserted and dispersed in the host material in homogenous manner.

Whatever the materials forming them, encapsulation films 10, 11 and film 12 containing the luminescent materials are perfectly chemically compatible thereby ensuring a loss-free optical transition for the light. A limited mixture of the different polymers may be made at the interfaces, in the following step. The refraction indexes of films 10, 11 and 12 are preferably substantially the same in order to ensure a good optical continuity in module 1.

Each of encapsulation films 10 and 11 can have been obtained for example by assembly of two different initial films, one containing luminescent materials and the other not containing any. These two initial films are cut to form the different parts of the final encapsulation film, once they have been assembled. A film with an alternation of areas containing and not containing luminescent material is thus obtained. These areas will, after hot pressing, form at least photo-active areas 8 and neutral areas 9.

The method is simple to perform. The polymer films in fact simply have to be judiciously cut and correctly assembled before the assembly step of the different elements of the module and the hot pressing step.

The assembly thus formed is hot pressed, for example in a laminating system, in order to obtain cohesion of said assembly: photovoltaic cells 4 are then brought into contact with encapsulation films 10 and 11 which then form, with film 12, encapsulation material 7 also called encapsulation medium. In addition, front plate 2 and rear plate 3 each come into contact with one of encapsulation films 10 and 11.

Preferably, the assembly is hot pressed by applying a pressure between the two plates and under a temperature generally comprised between 50° C. and 200° C. This temperature depends on the encapsulation film material used, for example for EVA this temperature is greater than or equal to 120°.

When this operation is performed, the polymer material or materials of films 10, 11 and 12 advantageously transit in viscous phase in order to intimately follow the shape of the photovoltaic cells while filling the interstitial spaces.

This embodiment is inexpensive and simple to implement, as it enables the luminescent elements, dispersed in a polymer material, to be easily positioned in the inter-cell spaces when assembly of module 1 is performed.

The luminescent elements are arranged such as to leave a neutral area 9 interposed between transparent plate 2 and photovoltaic cell 4 and configured to directly transmit incident electromagnetic radiation I from the transparent plate to the active face of the cell, between 40% and 90% of the active face 4a of cell 4 directly receiving the incident electromagnetic radiation. Active face 4a of each cell 4 therefore receives more photons and the conversion efficiency is improved.

Area 9 is, in this embodiment, formed for example by encapsulation film 10.

According to another particular embodiment, encapsulation film 10 can comprise at least one face a part of which is covered with a layer containing at least the luminescent material and forming spectral conversion areas 8, after hot pressing. Deposition of the luminescent material can also be performed on the face of encapsulation film 11.

Deposition can be performed by sol-gel means, by spraying, or by doctor-blading. A simple brush can also be used to deposit the luminescent materials. It can be used to deposit a liquid lacquer or a resin charged for example with luminescent materials. The lacquer can evaporate and leave the luminescent materials on the surface.

These deposition techniques are inexpensive to implement.

According to another embodiment, spectral conversion areas 8 are formed by deposition of a layer 14 containing at least the luminescent material, on a part of the face of one of transparent 2 or additional 3 plates.

This deposition is advantageously performed on a part of one of the faces of front plate 2, before the assembly step of module 1. The same deposition can in addition be performed on rear plate 3, in particular in the case of a two-face module. The depositions are preferably formed on inner surfaces 2a and 3a of front plate 2 and rear plate 3.

According to another embodiment, contact tracks 6 are covered by an area 8 containing luminescent elements. This area can for example be formed by deposition of a layer of luminescent material. Deposition can be performed by means of a brush or by spraying on contact tracks 6.

The embodiments described in the foregoing can be used separately or in combination with one another. Numerous combinations are in fact possible to position the photo-active areas and the neutral areas inside the photovoltaic module.

For comparison purposes, the electric power was measured for a photovoltaic module 1 of single-face type comprising two independent lines of three photovoltaic cells 4 representing two possible configurations in one and the same module: one according to the prior art and the other according to a particular embodiment of the invention. Cells 4 of a same line are electrically connected in parallel in order to increase the short-circuit or global photo-generation current of the module. The cells are pre-cut cells made from crystalline silicon having a width of a few centimeters and a thickness of about 200 μm.

Figure 8:
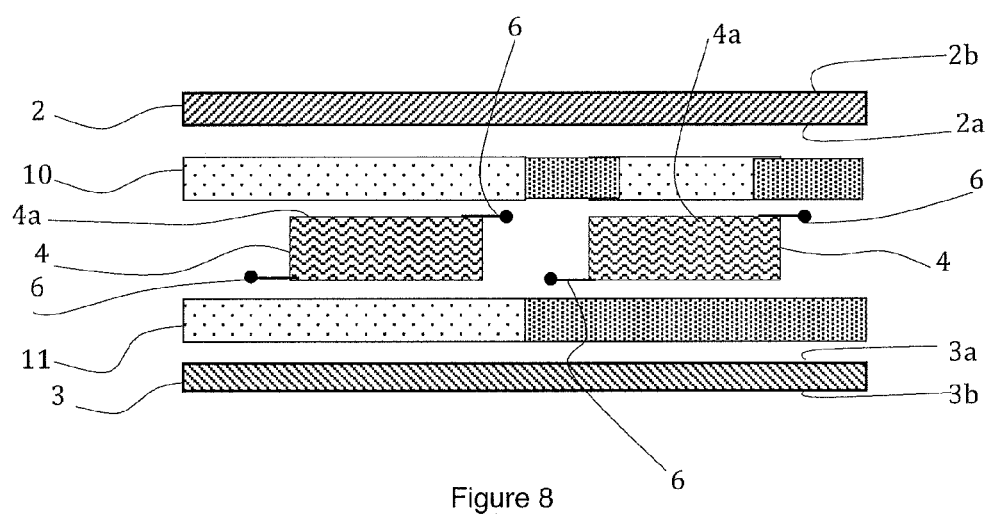
FIG. 8 represents a step of assembly of a photovoltaic module according to a particular embodiment of the invention, in schematic manner in cross-section.

The assembly step of module 1 is represented schematically in FIG. 8. Only two photovoltaic cells 4 have been represented, each belonging to one of the two lines.

Assembly of the photovoltaic module was performed from the stack comprising the following elements: a front plate 2 made from transparent glass, a first encapsulation film 10, the two lines of photovoltaic cells 4, a second encapsulation film 11 and a rear plate 3 formed by a sheet made from white plastic. The two encapsulation films 10 and 11 are formed by a self-supporting film of vinyl-acetate type.

Figure 9:
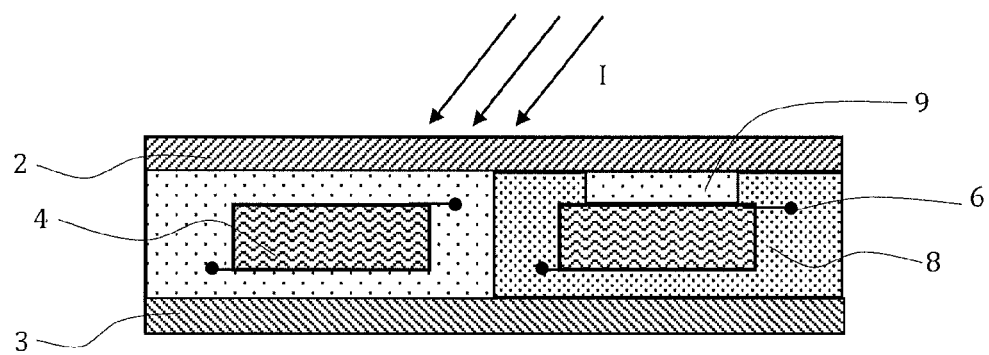
FIG. 9 represents a photovoltaic module obtained by hot pressing of the assembly according to FIG. 7, in schematic manner in cross-section.
Figure 10:
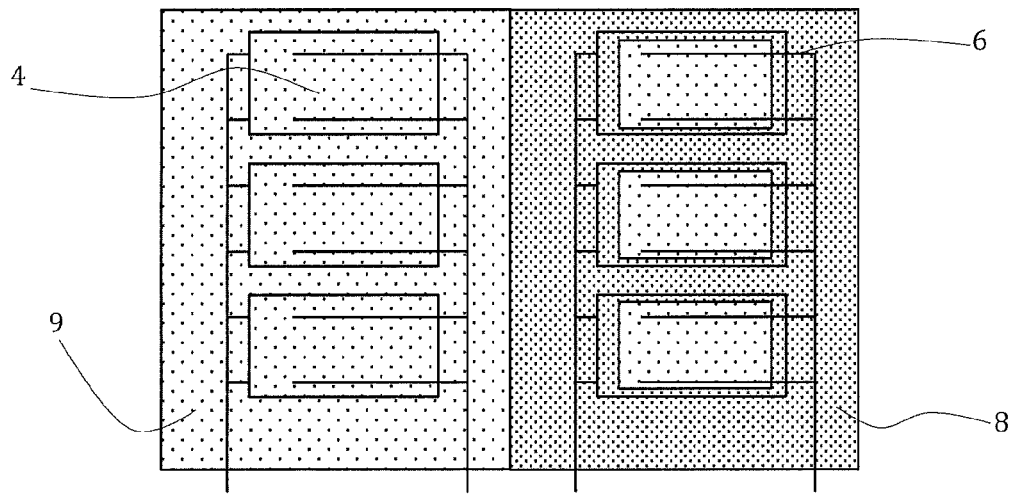
FIG. 10 represents a photovoltaic module obtained by hot pressing of the assembly according to FIG. 7 in schematic manner in top view.

For the first line of cells represented by the left-hand cell in FIGS. 8 and 9 and corresponding to the line of cells on the left in FIG. 10, the two encapsulation films 10 and 11 do not contain any luminescent material.

For the second line of cells represented by the right-hand cell in FIGS. 8 and 9 and corresponding to the line of cells on the right in FIG. 10, at least a part of encapsulation films 10 and 11 contains the luminescent materials able to convert a part of the ultraviolet into red light, with a quantum efficiency of more than 50%. Thus, for this part, the whole of the encapsulation film located between rear plate 3 and cells 4 contains luminescent materials dispersed in homogenous manner in the whole volume of said film 11. Encapsulation film 10, arranged when assembly is performed between front plate 2 and cells 4 of the second line, contains areas without luminescent materials. In FIGS. 8, 9 and 10, areas 8 with luminescent material cover the edges of active face 4a of the photovoltaic cells. An area 9 without any luminescent material is arranged in the centre of active face 4a of the cell, enabling direct transmission of incident electromagnetic radiation I.

Such an encapsulation film 10 containing areas with and without luminescent materials can have been obtained for example by assembly of two initial encapsulation films, one containing luminescent materials and the other not containing any luminescent materials. The two initial films are then cut and assembled to form different parts of final encapsulation film 10.

The assembly thus obtained is then hot pressed at 140° C. for about ten minutes in a 3S laminator under a pressure of 1 atmosphere in order to obtain the corresponding module 1, as represented in FIGS. 9 and 10.

The conversion efficiencies of the two lines of cells 4 were then measured before and after hot pressing.

For the first line of cells, the maximum electric power provided increases by 11.45% after hot pressing. For the second line of cells, the maximum electric power increases by 13.22% after hot pressing. A relative differential gain of +1.7% is then obtained for the cells surrounded by at least one photo-active area 8 containing the luminescent materials after lamination as compared with the cells that are not surrounded by luminescent materials. When fabrication of photovoltaic module 1 is performed, hot pressing thus enables the supplied power to be improved.

The presence of first areas 8 in photovoltaic module 1 therefore enables the supplied power to be increased as compared with a module not containing such areas.

The present invention is particularly pertinent for photovoltaic modules having a cell packing factor (ratio between the total surface of the cells and the surface of the module) of substantially less than 1, and more particularly for a cell packing factor comprised between 0.5 and 0.95. If the cell packing factor is close to 1, i.e. the spaces between the cells are very narrow, the advantage of using luminescent materials in said spaces is in fact then reduced. The size and/or number of these inter-cell spaces has to be increased. However, if the cell packing factor becomes low, the electric power delivered by the photovoltaic module also decreases, but this decrease can be partially compensated by the waveguide effects.

Advantageously, such photovoltaic modules enable waveguide effects and more particularly lateral waveguide effects to be used. What is meant by lateral waveguide is the internal reflection of an electromagnetic radiation in the longitudinal direction of the photovoltaic module, the module in general being planar.

Photovoltaic modules as described in the foregoing present the advantage of being easier and less expensive to manufacture than modules requiring the presence of reflectors. Nevertheless, luminescent materials can be used in a photovoltaic module equipped with a reflector on the rear surface to increase the power generated by the photovoltaic module.

Photovoltaic modules containing the spectral conversion elements according to the invention present the advantage of being able to be of single-face and two-face type. These optic amplification devices are inexpensive and can be produced on a large scale. They will find a large number of applications and will be able to be used for example as integrated photovoltaic modules in the building industry. Modules of two-face type with a low cell packing factor will thus be able to be used to produce for example semi-transparent canopies or windows generating electric power. The incident radiation passing through the inter-cell spaces is partially used without however compromising satisfactory passage of light to the medium located behind. The colouring due to the presence of the luminescent materials furthermore adds an aesthetic aspect to the photovoltaic module.

The invention is not limited to the embodiments described in the foregoing. In particular, photovoltaic modules 1 described above comprise a plurality of photovoltaic cells 4 presenting coplanar active faces 4a separated from one another by inter-cell spaces 5.

However, the invention can also apply to a photovoltaic module only containing a single photovoltaic cell and to the production method of the latter.

Furthermore, photovoltaic module 1 can be of any shape. It can be in the shape of a thin rigid rectangle with a thickness of a few centimeters. It can also be in the form of a flexible and resistant membrane. The length and width depend on the applications involved and will be chosen in suitable manner. Photovoltaic module 1 can be planar or curved in the form of a solar tile.

In the same way, the photovoltaic cells can have different shapes. They can be rectangular, circular, square, truncated, solid or perforated, i.e. provided with at least one pass-through hole.

Thus, for perforated cells, photo-active areas 8 can be situated in the holes of the cell. Likewise, photovoltaic cells in the form of a pad, i.e. in the form of a disk, can be arranged in a grid and surrounded by luminescent materials.

A large choice of shape of photovoltaic cells 4 can thus be used for producing photovoltaic modules 1.

Transparent glass plates on the front face and/or robust plastic films on the rear face themselves comprising the luminescent materials could be used for example for flexible modules.

Wavelength-selective module glasses, such as dichroic glasses, could in addition be used to obtain a better selection of the wavelengths of the incident radiation.

Finally, in a particular embodiment, several luminescent materials could be used in cascade. For example, a first luminescent material called down-conversion material absorbs at least a part of the incident electromagnetic radiation and re-emits the light at higher wavelengths, i.e. at lower energy. This re-emitted light can then be absorbed by a second luminescent material which itself re-emits light at higher wavelengths. Preferably, such a cascade can be used, at the beginning of the chain of luminescent materials, to absorb in the ultraviolet, for example between 350 nm and 400 nm, and at the end of the chain to re-emit in the infrared, for example advantageously between 900 nm and 1000 nm for silicon cells.

The invention claimed is:

1. A photovoltaic module to convert an incident electromagnetic radiation into electric power, comprising:
    at least one plate transparent to the incident electromagnetic radiation,
    at least one photovoltaic cell comprising an active face arranged facing said transparent plate,
    a spectral conversion element comprising a luminescent material designed to be excited by the incident electromagnetic radiation and formed by at least one first spectral conversion area arranged facing a lateral face of the photovoltaic cell,
    at least one direct transmission area separating the transparent plate from the photovoltaic cell and configured to transmit the incident electromagnetic radiation directly from the transparent plate to at least a part of the active face of the photovoltaic cell,
    wherein the spectral conversion element comprises a second spectral conversion area extending the first spectral conversion area, said second spectral conversion area being positioned on the peripheral edge of the active face of the photovoltaic cell, directly on said active face, so that the part of the active face of the photovoltaic cell directly receiving the incident electromagnetic radiation represents between 40% and 90% of the total surface of the active face of the photovoltaic cell.

2. The photovoltaic module according to claim 1, wherein the photovoltaic module comprises a plurality of coplanar photovoltaic cells separated from one another by inter-cell spaces and each inter-cell space is occupied by a first spectral conversion area.

3. The photovoltaic module according to claim 1, wherein the cell packing factor is comprised between 0.5 and 0.95.

4. The photovoltaic module according to claim 1, wherein the ratio between the optical index of the direct transmission area and the optical index of the spectral conversion areas is comprised between 0.9 and 1.2.

5. The photovoltaic module according to claim 1, comprising at least one encapsulation material.

6. The photovoltaic module according to claim 5, wherein the photovoltaic cell is sunk in the at least one polymer encapsulation material.

7. The photovoltaic module according to claim 5, wherein the direct transmission area is formed by the encapsulation material.

8. The photovoltaic module according to claim 1, wherein the spectral conversion areas comprise a matrix.

9. The photovoltaic module according to claim 8, wherein the matrix is formed by an encapsulation material.

10. The photovoltaic module according to claim 9, wherein the encapsulation material is made from polymer, the luminescent material being dispersed in said polymer.

11. The photovoltaic module according to claim 1, wherein the luminescent material is chosen from organic colorants, optical brighteners, microparticles or nanoparticles doped with lanthanide ions, organo-lanthanide complexes, quantum dots, phosphorescent species among which aluminates doped with rare earth ions, calcium aluminates, sulphide compounds, alumino-silicates and mixtures of the latter.

12. A method for producing a photovoltaic module according to claim 11, comprising:
    formation of an assembly comprising at least the transparent plate and an additional plate between which there are placed the photovoltaic cell, the spectral conversion element, the direct transmission area, at least one encapsulation film placed between the transparent plate and the photovoltaic cell, the spectral conversion element being arranged facing a lateral face of the photovoltaic cell and between the photovoltaic cell and the transparent plate, on the edges of the active face of the photovoltaic cell, hot pressing of said assembly to obtain the photovoltaic module.

13. The method for producing a photovoltaic module according to claim 11, wherein the at least one encapsulation film is made from polymer material.

14. The method for producing a photovoltaic module according to claim 11, wherein the encapsulation film comprises at least one surface a part of which is covered by a layer containing at least the luminescent material and forming the spectral conversion areas, after hot pressing.

15. The method for producing a photovoltaic module according to claim 11, wherein the spectral conversion areas are formed by deposition of a layer containing at least the luminescent material on a part of the face of one of the transparent or additional plates.

16. The method for producing a photovoltaic module according to claim 11, wherein an additional encapsulation film, advantageously made from polymer material, is placed, when formation of the assembly is performed, facing a lateral surface of the photovoltaic cell said additional encapsulation film comprising the luminescent material in dispersed form.

17. The method for producing a photovoltaic module according to claim 11, wherein the encapsulation film comprises at least two parts, one containing the luminescent material and the other without any luminescent material and respectively forming, after hot pressing, at least the spectral conversion areas and the direct transmission area.

* * * * *